United States Patent
Bulja et al.

(10) Patent No.: US 10,804,587 B2
(45) Date of Patent: Oct. 13, 2020

(54) ELECTRICALLY CONTROLLABLE RADIO-FREQUENCY CIRCUIT ELEMENT HAVING AN ELECTROCHROMIC MATERIAL

(71) Applicant: Alcatel Lucent, Paris (FR)

(72) Inventors: Senad Bulja, Dublin (IE); Rose F. Kopf, Green Brook, NJ (US)

(73) Assignee: ALCATEL LUCENT, Nozay (FR)

( * ) Notice: Subject to any disclaimer, the term of this patent is extended or adjusted under 35 U.S.C. 154(b) by 22 days.

(21) Appl. No.: 16/018,212

(22) Filed: Jun. 26, 2018

(65) Prior Publication Data

US 2018/0301783 A1    Oct. 18, 2018

Related U.S. Application Data

(63) Continuation of application No. 14/272,190, filed on May 7, 2014, now Pat. No. 10,033,080.

(51) Int. Cl.
| | |
|---|---|
| *H01P 5/02* | (2006.01) |
| *G01R 27/06* | (2006.01) |
| *H01P 3/00* | (2006.01) |
| *G01R 27/28* | (2006.01) |
| *G01R 27/26* | (2006.01) |

(52) U.S. Cl.
CPC ............. *H01P 5/028* (2013.01); *G01R 27/06* (2013.01); *G01R 27/2617* (2013.01); *G01R 27/28* (2013.01); *H01P 3/006* (2013.01)

(58) Field of Classification Search
CPC ..... H01P 5/028; H01P 3/006; G01R 27/2617; G01R 27/06; G01R 27/28
See application file for complete search history.

(56) References Cited

U.S. PATENT DOCUMENTS

| | | | |
|---|---|---|---|
| 6,646,522 B1 | 11/2003 | Kozyrev et al. | |
| 7,876,143 B2 | 1/2011 | Sasaki | |
| 7,973,618 B2 | 7/2011 | Nam et al. | |
| 8,008,836 B2 | 8/2011 | Du et al. | |
| 8,427,254 B2 | 4/2013 | Shinohara et al. | |
| 8,456,255 B2 | 6/2013 | Iluz | |
| 8,610,477 B2 | 12/2013 | Koechlin et al. | |
| 8,614,848 B2 | 12/2013 | Ueda et al. | |
| 2003/0072549 A1 | 4/2003 | Face et al. | |

(Continued)

FOREIGN PATENT DOCUMENTS

EP    0358497 A2    3/1990

OTHER PUBLICATIONS

C. G. Granquist, "Handbook of Inorganic Electrochromic Materials", Elsevier Science B.V., Amsterdam, ISBN: 0444-89930-8, 1995; 619 pages.

(Continued)

*Primary Examiner* — Akm Zakaria
(74) *Attorney, Agent, or Firm* — Mendelsohn Dunleavy, P.C.; Yuri Gruzdkov

(57) ABSTRACT

We disclose an electrically controllable RF-circuit element that includes an electrochromic material. In an example embodiment, the electrically controllable RF-circuit element is configured to operate as a phase shifter whose phase-shifting characteristics can be changed using a dc-bias voltage applied to a multilayered structure containing a layer of the electrochromic material.

23 Claims, 7 Drawing Sheets

(56) References Cited

U.S. PATENT DOCUMENTS

| | | | |
|---|---|---|---|
| 2003/0227416 A1* | 12/2003 | Meitzler | H01Q 19/06 343/755 |
| 2003/0227664 A1 | 12/2003 | Agrawal et al. | |
| 2005/0094927 A1* | 5/2005 | Kish, Jr. | B82Y 20/00 385/14 |
| 2008/0204850 A1 | 8/2008 | Agrawal et al. | |
| 2010/0066389 A1 | 3/2010 | Subramanyam | |
| 2010/0079222 A1 | 4/2010 | Makita | |
| 2010/0182105 A1* | 7/2010 | Hein | H01P 3/003 333/239 |
| 2010/0258745 A1 | 10/2010 | Wisnudel et al. | |
| 2013/0106456 A1 | 5/2013 | Weikle, II et al. | |
| 2014/0043668 A1* | 2/2014 | Bergh | G02F 1/153 359/265 |

OTHER PUBLICATIONS

P. M. S. Monk, R. J. Mortimer and D. R. Rosseinsky, "Electrochromism and Electrochromic Devices" Cambridge University Press, ISBN-13, 978-0-521-82269-5, 2007; 512 pages.

R. E. Collin, Foundations for Microwave Engineering, McGraw-Hill, 2nd edition, 1992, ch. 3; pp. 71-219.

Di Paolo, Franco, Ph.D., "Coplanar Waveguides," Networks and Devices Using Planar Transmissions Lines, Chapter 10, Boca Raton: CRC Press LLC, 2000 (32 pages).

"Theoretical Characterization of Coplanar Waveguide Transmission Lines and Discontinuities," www.eecs.umich.edu, 1992 [retrieved on Jan. 24, 2014]. Retrieved from the Internet: <URL: http://http://www.eecs.umich.edu/RADLAB/html/techreports/RL886.pdf.> (218 pages).

Costanzo, S., "Synthesis of Multi-Step Coplanar Waveguide-to-Microstrip Transition," Progress in Electromagnetics Research, vol. 113, 111-126, 2011, (16 pages).

Coonrod, John, et al., "Comparing Microstrip and CPW Performance," European Microwave Integrated Circuits Conference (EuMIC), Jul. 2011, vol. 55, No. 7, pp. 74-82.

Kyabaggu, Peter B. K., et al., "Wideband 3D Coplanar Waveguide to Thin-Film Microstrip Transition in Multilayer Technology," Proceedings of the 6th European Microwave Integrated Circuits Conference, 2011, pp. 604-607.

"Coplanar-Microstrip Transitions for Ultra-Wideband Communications," www.intechopen.com, 2011 [retrieved on Jan. 24, 2014]. Retrieved from the Internet: <URL: http://www.intechopen.com/download/pdf/17811> (23 pages).

Xuping, Zhang et al., "An All-Solid-State Inorganic Electrochromic Display of WO3 and NiO Films with LiNbO3 Ion Conductor," IEEE Electron Device Letters, vol. 21, No. 5, May 2000, pp. 215-217.

Pucel, Robert A. et al., "Losses in Microstrip," IEEE Transactions on Microwave Theory and Techniques, vol. MTT-16, No. 6, Jun. 1968, pp. 342-350.

Bulja, Senad et al., "Novel Wideband Transition Between Coplanar Waveguide and Microstrip Line," IEEE Transactions on Microwave Theory and Techniques, vol. 58, No. 7, Jul. 2010, pp. 1851-1857.

Reed, J. et al., "A Method of Analysis of Symmetrical Four-Port Networks," IRE Transactions on Microwave Theory and Techniques, 1956, vol. 4, No. 4, pp. 246-252.

Vergaz, Ricardo et al., "Electrical Analysis of New All-Plastic Electrochromic Devices," Optical Engineering, 2006, vol. 45, No. 11 (9 pages).

Vergaz, Ricardo et al., "Electrical Characterization of New Electrochromic Devices," Spanish Conference on Electron Devices, 2007, pp. 150-153.

Lee, Se-Hee Lee, et al., "Electrochromic Mechanism in a-WO3_2y Thin Films," Applied Physics Letters vol. 74, No. 2, Jan. 11, 1999, pp. 242-244.

Argun, Avni A., et al., "Multicolored Electrochromism in Polymers: Structures and Devices," Published in Chemistry Materials, 2004, vol. 16, pp. 4401-4412.

\* cited by examiner

100

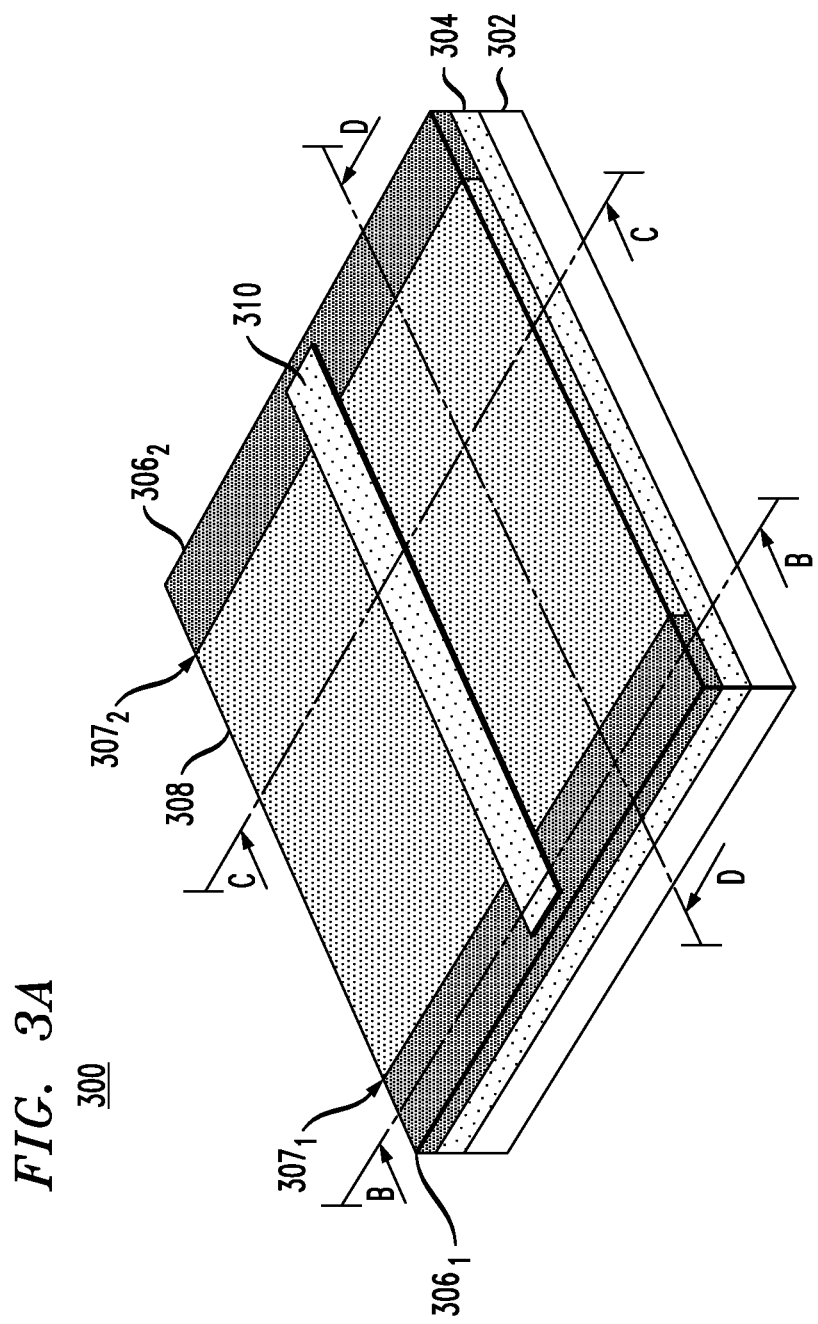

300    BB

300    CC

300    DD

400

400  BB

400  CC

400  DD

ELECTRICALLY CONTROLLABLE RADIO-FREQUENCY CIRCUIT ELEMENT HAVING AN ELECTROCHROMIC MATERIAL

CROSS-REFERENCE TO RELATED APPLICATIONS

This application is a continuation of U.S. patent application Ser. No. 14/272,190, filed on May 7, 2014, and entitled "ELECTROCHROMIC CELL FOR RADIO-FREQUENCY APPLICATIONS," which is incorporated herein by reference in its entirety.

BACKGROUND

Field

The present disclosure relates to electrical circuits and, more specifically but not exclusively, to electrically controllable radio-frequency (RF) circuit elements, such as variable phase shifters.

Description of the Related Art

This section introduces aspects that may help facilitate a better understanding of the disclosure. Accordingly, the statements of this section are to be read in this light and are not to be understood as admissions about what is in the prior art or what is not in the prior art.

A phase shifter is a device in which the phase of an electromagnetic wave or electrical signal can be controllably shifted. Phase shifters can be analog or digital. An analog phase shifter provides a continuously variable phase change within the specified tunability range. A digital phase shifter provides a stepwise phase change within the specified tunability range, wherein a finite, relatively small number (e.g., between two and thirty-two) of discrete phase-change values is available. Conventional electrically controlled phase shifters can be realized, e.g., with (i) varactor diodes whose capacitance can be changed with a bias voltage, (ii) nonlinear dielectric materials, such as barium strontium titanate, and (iii) ferroelectric materials, such as yttrium iron garnet. Variable phase shifters find use in various radio-frequency circuits and systems, such as beam-steering transmitters, phase-array antennas, power dividers, linear power amplifiers, phase discriminators, etc.

SUMMARY OF SOME SPECIFIC EMBODIMENTS

Disclosed herein are various embodiments of an electrically controllable RF-circuit element that includes an electrochromic material. In an example embodiment, the electrically controllable RF-circuit element is configured to operate as a phase shifter whose phase-shifting characteristics can be changed using a dc-bias voltage applied to a multilayered structure containing a layer of the electrochromic material.

According to one embodiment, provided is an apparatus comprising an electrical circuit configured to process an electrical RF signal, wherein the electrical circuit comprises a multilayered structure that includes a layer of a first electrochromic material.

BRIEF DESCRIPTION OF THE DRAWINGS

Other aspects, features, and benefits of various disclosed embodiments will become more fully apparent, by way of example, from the following detailed description and the accompanying drawings, in which:

FIGS. 3A-3D show various schematic views of a radio-frequency (RF) circuit element according to an embodiment of the disclosure;

DETAILED DESCRIPTION

The convention followed for variable phase shifters is that the shifter configuration corresponding to the smallest available phase shift is referred to as the "reference" or "OFF" state, and the shifter configuration corresponding to the largest available phase shift is referred to as the "ON" state. The phase-shift difference between the OFF and ON states is referred to as the total phase variance.

The term "radio frequency" (often abbreviated as RF) refers to a rate of oscillation in the range from about 3 kHz to about 300 GHz. This term may be used in reference to carrier frequencies of alternating electrical currents and (wireless) radio waves and in reference to the spectral content of modulation waveforms used in optical signals.

An electrochromic (EC) material is broadly defined as a material whose optical absorption/transmission characteristics can be reversibly changed by an application of an external voltage, light source, or electric field. Representative examples of EC materials include but are not limited to (i) transition-metal and inorganic oxides, such as tungsten oxide; (ii) small organic molecules, such as viologens; and (iii) polymers, such as poly-viologens and derivatives of poly-thiophene, polypyrrole, and polyaniline.

Figure 1:
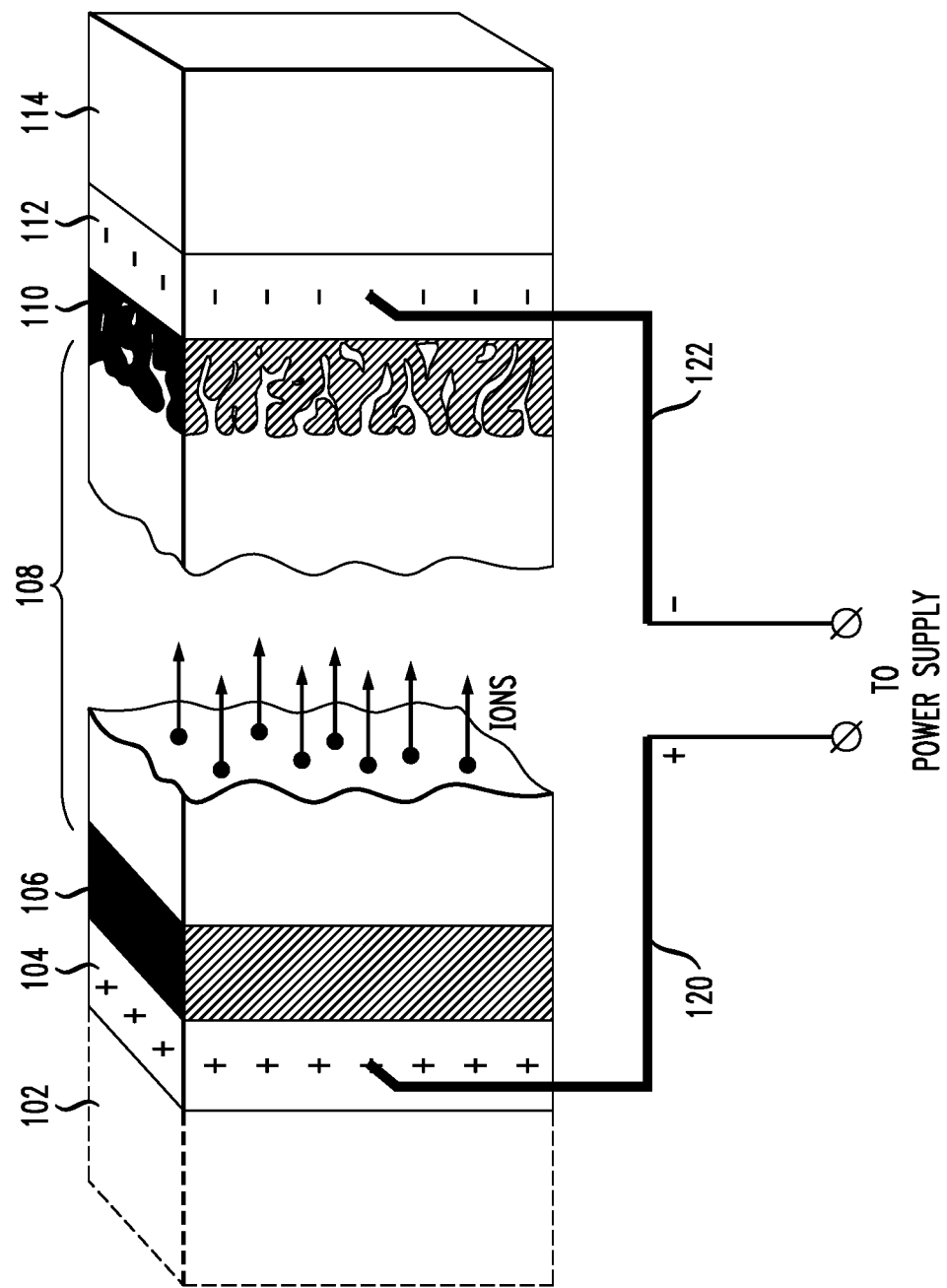
FIG. 1 schematically shows a multilayered structure having an electrochromic material according to an embodiment of the disclosure.

FIG. 1 shows a schematic view of a multilayered structure 100 having an EC material according to an embodiment of the disclosure. Structure 100 has a substrate 114 on which the other layers of the structure may be formed during the fabrication process. In one embodiment, substrate 114 is a glass or semiconductor layer. In some embodiments, substrate 114 may itself be a multilayered structure. In some embodiments, substrate 114 may include a polymer, such as polyethylene terephthalate. Substrate 114 may or may not be transparent to visible light.

Structure 100 further includes two electrode layers, 104 and 112, configured to be electrically connected to a power supply via electrical leads 120 and 122, e.g., as indicated in FIG. 1. Layer 112 is made of an electrically conducting material (e.g., a metal or metallic alloy) and is configured as a cathode. Layer 104 is also made of an electrically conducting material and is configured as an anode. The electrically conducting material of layer 112 may be the same as or different from the electrically conducting material of layer 104. In some embodiments, one or both of electrode layers 104 and 112 may be omitted from the structure. If electrode layer 104 is omitted, then electrical lead 120 may be directly electrically connected to an ion-storage layer 106. If electrode layer 112 is omitted, then electrical lead 122 may be directly electrically connected to an EC layer 110. In some embodiments, one or both of electrode layers 104 and 112 may be made of indium tin oxide, or some other transparent electrically conducting material. In some embodiments, one or both of electrode layers 104 and 112 may include gold.

EC layer 110 may comprise any suitable EC material, such as $WO_3$, $TiO_2$, $MoO_3$, $Ta_2O_5$, $Nb_2O_5$, or any of other above-mentioned or known EC materials. It may be beneficial when EC layer 110 has good electrical conductivity. In different embodiments, ion-storage layer 106 may or may not be present. When structure 100 has ion-storage layer 106, it may be beneficial to make that layer of an EC material that exhibits electrochromic characteristics complimentary to those of EC layer 110. Example materials that can be used for ion-storage layer 106 are NiO, $Cr_2O_3$, $MnO_2$, $FeO_2$, $CoO_2$, $RhO_2$, and $IrO_2$. Other suitable materials can also be used.

An ion-conductor (solid electrolyte) layer 108 serves as a reservoir of ions for injection into EC layer 110. Ion-conductor layer 108 may also receive and/or inject ions from/into ion-storage layer 106. It may be beneficial to make ion-conductor layer 108 from a material that has different conductivities for ions and electrons.

An optional outer layer 102 may be deposited over electrode layer 104 to encapsulate the other layers of structure 100, e.g., for protection and/or structural integrity. In an example embodiment, outer layer 102 may be made of glass or polymer.

When voltage is applied to electrical leads 120 and 122, a corresponding electric field is generated between electrode layers 104 and 112. This electric field causes ions to be introduced into EC layer 110 from ion-conductor layer 108. The electrical charge caused by this injection of ions into EC layer 110 is neutralized by a corresponding charge-balancing counter flow of electrons from electrode layer 112. This injection of ions and electrons into EC layer 110 causes a persistent change of its optical properties, such as color, due to electrochromism. Note that a similar effect can also be achieved using an external light source.

As an illustration, for an embodiment in which EC layer 110 comprises tungsten oxide, $WO_3$, the relevant electrochemical processes therein are believed to be described by the following simplified redox reaction:

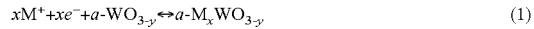

where M can be H, Li, etc.; and a, x, and y are stoichiometric coefficients. $a\text{-}WO_{3-y}$ is typically colorless, while $a\text{-}M_xWO_{3-y}$ is typically blue. When ion-storage layer 106 comprises polyaniline, the relevant electrochemical processes therein are believed to be described by the following simplified redox reaction:

where p-An is polyaniline; and $A^-$ is a counter-anion. p-An is typically pale yellow, while $(p\text{-}An)A_x$ may be green or blue.

Reaction (1) indicates that the color change in EC layer 110 occurs upon ion and electron intercalation from layers 108 and 112, respectively. Reaction (2) similarly indicates that the color change in ion-storage layer 106 occurs upon ion intercalation from ion-conductor layer 108 and electron de-intercalation into electrode layer 104. Both EC layers (i.e., ion-storage layer 106 and EC layer 110) in structure 100 may exhibit an open-circuit memory, meaning that, once a certain state, colored or bleached, is attained via the application of the corresponding dc-bias voltage to electrical leads 120 and 122, the dc-bias voltage can be switched OFF, with the attained state of the EC layers persisting for a prolonged period of time. The lifetime of the open-circuit memory in structure 100 may depend relatively strongly on the types of EC materials used in layers 106 and 110, the type of solid electrolyte used in ion-conductor layer 108, and the resistive load connected to electrical leads 120 and 122.

Conventional applications of EC materials mostly utilize and rely on the changes in the characteristics of EC materials in the visible range of the electromagnetic spectrum, e.g., as detailed in the review article by Avni A. Argun, Pierre-Henri Aubert, Barry C. Thompson, et al., entitled "Multicolored Electrochromism in Polymers: Structures and Devices," published in Chem. Mater., 2004, v. 16, pp. 4401-4412, which is incorporated herein by reference in its entirety. In contrast, we have realized that the changes in the characteristics of an EC material in the visible range of the electromagnetic spectrum may also be indicative of relatively strong concurrent changes in the characteristics of the EC material in the RF or microwave range of the electromagnetic spectrum. Hence, the EC materials for which the change in the dielectric constant is relatively large can advantageously be used to create novel electrically controlled, tunable circuit elements for a wide range of RF and/or microwave applications. Although the subsequent description gives variable phase shifters as examples of such electrically controlled, tunable RF-circuit elements, the scope of the disclosure is not so limited. Based on the provided description, one of ordinary skill in the art will understand how to make and use other electrically or optically controllable, tunable RF-circuit elements having one or more EC materials therein.

Figure 2:
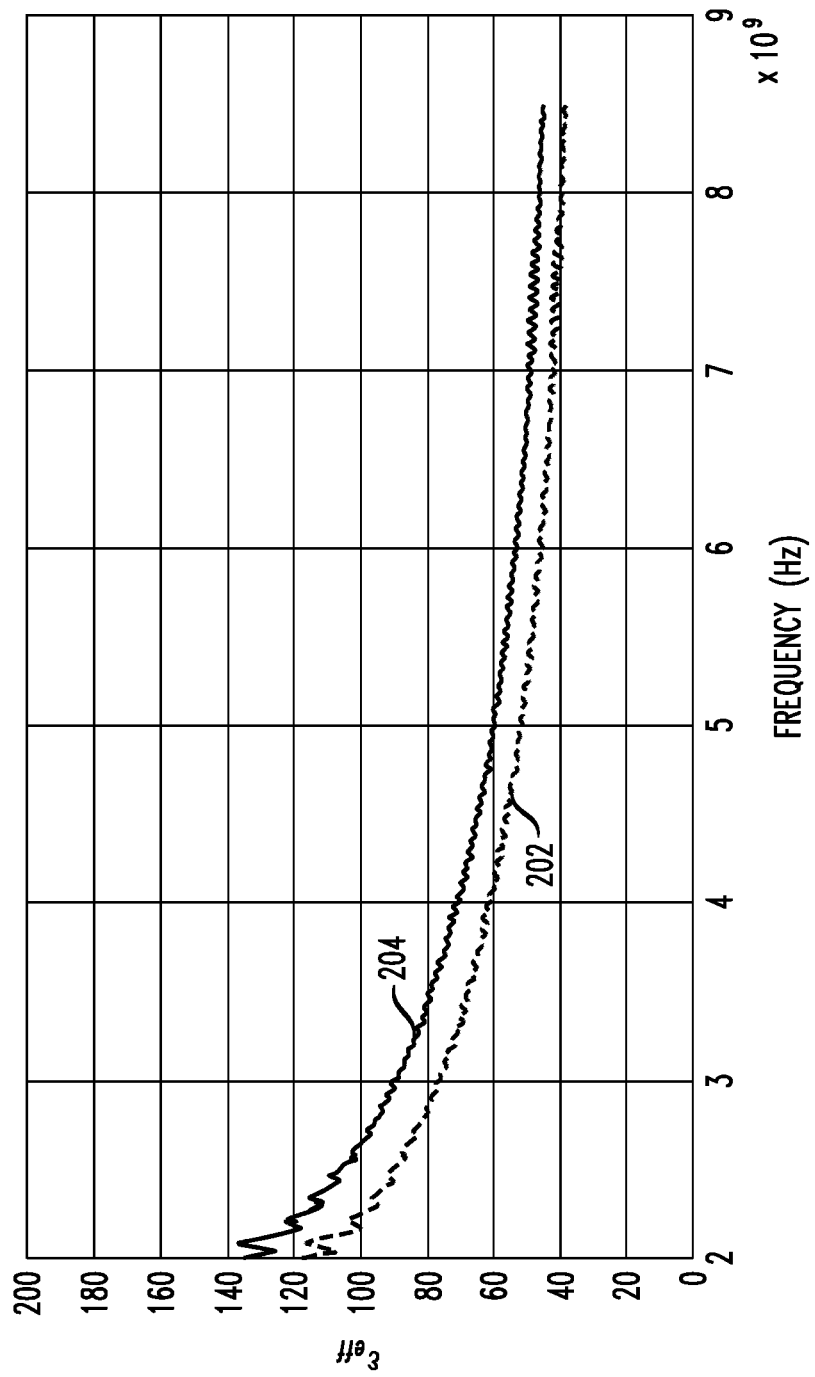
FIG. 2 graphically shows the effective dielectric constant of the multilayered structure of FIG. 1 according to an embodiment of the disclosure.

FIG. 2 graphically shows the effective dielectric constant, Cell, of multilayered structure 100 (FIG. 1) according to an embodiment of the disclosure. More specifically, the data depicted in FIG. 2 correspond to the following example parameters and composition of multilayered structure 100:

substrate 114: silicon;
electrode layer 112: gold, 1 μm;
EC layer 110: tungsten oxide, 150 nm;
ion-conductor layer 108: lithium niobate, 600 nm;
ion-storage layer 106: nickel oxide, 120 nm;
electrode layer 104: gold, 500 nm; and
outer layer 102: not present.

Note that, in alternative embodiments, the layers may be made of other suitable materials and have other thickness values, depending on the desired performance characteristics of the corresponding multilayered structure. Curves 202 and 204 correspond to the dc voltage of 0 and −3V, respectively, between electrical leads 120 and 122.

The difference between curves 202 and 204 clearly shows a change in the effective dielectric constant of structure 100 that is at least about 20% in the frequency range between about 2 GHz and about 9 GHz. The overall increase in the value of the effective dielectric constant at frequencies lower than about 5 GHz is attributed to the skin effect. In an alternative embodiment, this overall increase can be reduced, e.g., by employing electrode layers 104 and 112 of a larger thickness. One of ordinary skill in the art will understand that voltage-controlled changes in the effective dielectric constant similar to those shown in FIG. 2 can be achieved with other EC materials and compositions of structure 100 and that those voltage-controlled changes can be used to create novel electrically controlled, tunable RF-circuit elements, e.g., as further described below in reference to FIGS. 3-4.

Figure 3B:
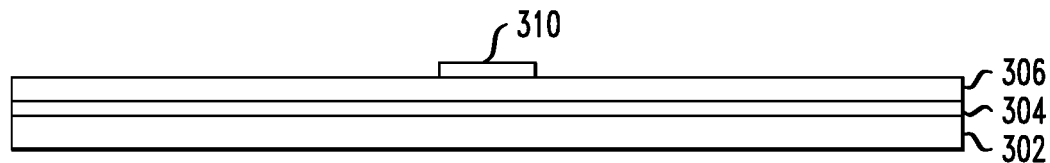
Figure 3C:
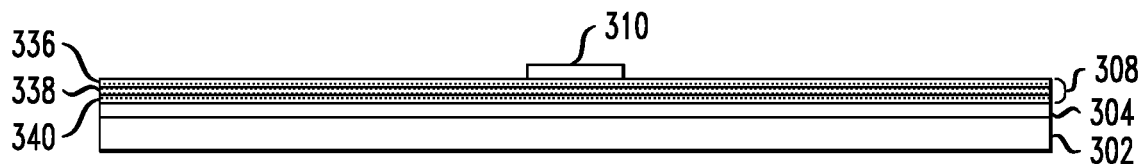
Figure 3D:
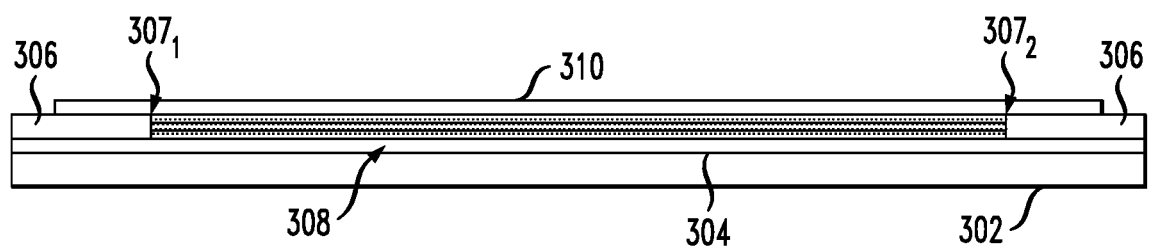

FIGS. 3A-3D show various schematic views of an RF-circuit element 300 according to an embodiment of the disclosure. More specifically, FIG. 3A shows (not to scale) a three-dimensional view of element 300. FIGS. 3B-3D show (not to scale) cut-away side views of element 300 corresponding to cross-section planes BB, CC, and DD, respectively, shown in FIG. 3A.

Element 300 comprises a substrate layer 302 on which other layers of the element are formed. Substrate layer 302 may be a portion of a larger substrate on which other circuit elements of the corresponding RF circuit are formed as known in the art. In an example embodiment, substrate layer 302 comprises silicon and/or silicon oxide. In some embodiments, substrate layer 302 may comprise two or more sub-layers (not explicitly shown in FIG. 3).

Element 300 further comprises an electrically conducting (e.g., metal or metal-alloy) base layer 304 formed on substrate layer 302. In operation, layer 304 may be electrically connected to a reference (e.g., ground) terminal of the power supply and function as a ground plane of element 300.

Formed on base layer 304 are a dielectric layer 306 and a multilayered structure 308. Dielectric layer 306 has two parts that are laterally separated by multilayered structure 308 (see FIGS. 3A and 3D). Junctions $307_1$ and $307_2$ between multilayered structure 308 and the two parts of dielectric layer 306 are marked in FIG. 3A. A cross-sectional side view of junctions $307_1$ and $307_2$ is also shown in FIG. 3D. As can be seen in FIG. 3D, multilayered structure 308 has substantially the same thickness as dielectric layer 306 to enable a microstrip line 310 formed over said dielectric layer and said multilayered structure to be flat and straight.

In an example embodiment, multilayered structure 308 comprises three layers, labeled 336, 338, and 340, respectively (see, e.g., FIG. 3C). Layers 336, 338, and 340 of multilayered structure 308 are functionally analogous to ion-storage layer 106, ion-conductor layer 108, and EC layer 110, respectively, of multilayered structure 100 (FIG. 1). In alternative embodiments, multilayered structure 308 may have more or fewer than three layers, e.g., as explained above in reference to multilayered structure 100. For example, in one alternative embodiment, multilayered structure 308 may have one or two additional layers (not explicitly shown in FIG. 3C), e.g., functionally analogous to electrode layers 104 and 112 shown in FIG. 1. As another example, an embodiment of multilayered structure 308 may not have layers analogous to the layers that have been indicated as "optional" in the above description of multilayered structure 100 (FIG. 1).

In an example embodiment, base layer 304 can be configured to function as a first electrode layer for multilayered structure 308 (e.g., analogous to electrode layer 112 in multilayered structure 100). Microstrip line 310 can similarly be configured to function as a second electrode layer for multilayered structure 308 (e.g., analogous to electrode layer 104 in multilayered structure 100). The width of microstrip line 310 may be selected to be much greater (e.g., by a factor of about ten or more) than the thickness of multilayered structure 308 to reduce (e.g., to a negligible level) the contribution into the performance characteristics of element 300 of the fringe electrical fields generated at the edges of the microstrip line.

An example fabrication method that can be used to manufacture RF-circuit element 300 is disclosed, e.g., in the above-cited concurrently filed patent application by Senad Bulja and Rose Kopf entitled "ELECTROCHROMIC CELL FOR RADIO-FREQUENCY APPLICATIONS." Additional fabrication methods that may be useful for implementing the manufacturing process of element 300 are disclosed, e.g., in U.S. Pat. No. 8,614,848, which is incorporated herein by reference in its entirety.

In one embodiment, RF-circuit element 300 may be configured to operate as a variable, electrically controllable phase shifter. In operation, the electrical RF signal that needs to be phase-shifted is applied to microstrip line 310, with base layer 304 configured as the ground terminal. In the OFF state of the phase shifter, microstrip line 310 is not dc-biased. In the ON state of the phase shifter, a dc-bias voltage of about 3 V is applied to microstrip line 310 in addition to the electrical RF signal. The total phase variance ($\Delta\varphi$) achieved in this manner in element 300 is given by Eq. (3):

$$\Delta\varphi = \frac{2\pi}{\lambda_0} L \left( \sqrt{\varepsilon_{\it eff\_ON}} - \sqrt{\varepsilon_{\it eff\_OFF}} \right) \quad (3)$$

where $\varepsilon_{\it eff\_ON}$ and $\varepsilon_{\it eff\_OFF}$ represent the effective dielectric-constant values of multilayered structure 308 with and without the dc-bias voltage applied to microstrip line 310; $\lambda_0$ is the free-space wavelength of the electrical RF signal carried by microstrip line 310; and L is the length of microstrip line 310 exposed to multilayered structure 308. Example values of $\varepsilon_{\it eff\_ON}$ and $\varepsilon_{\it eff\_OFF}$ can be obtained, e.g., from curves 204 and 202, respectively, in FIG. 2.

Figure 4A:
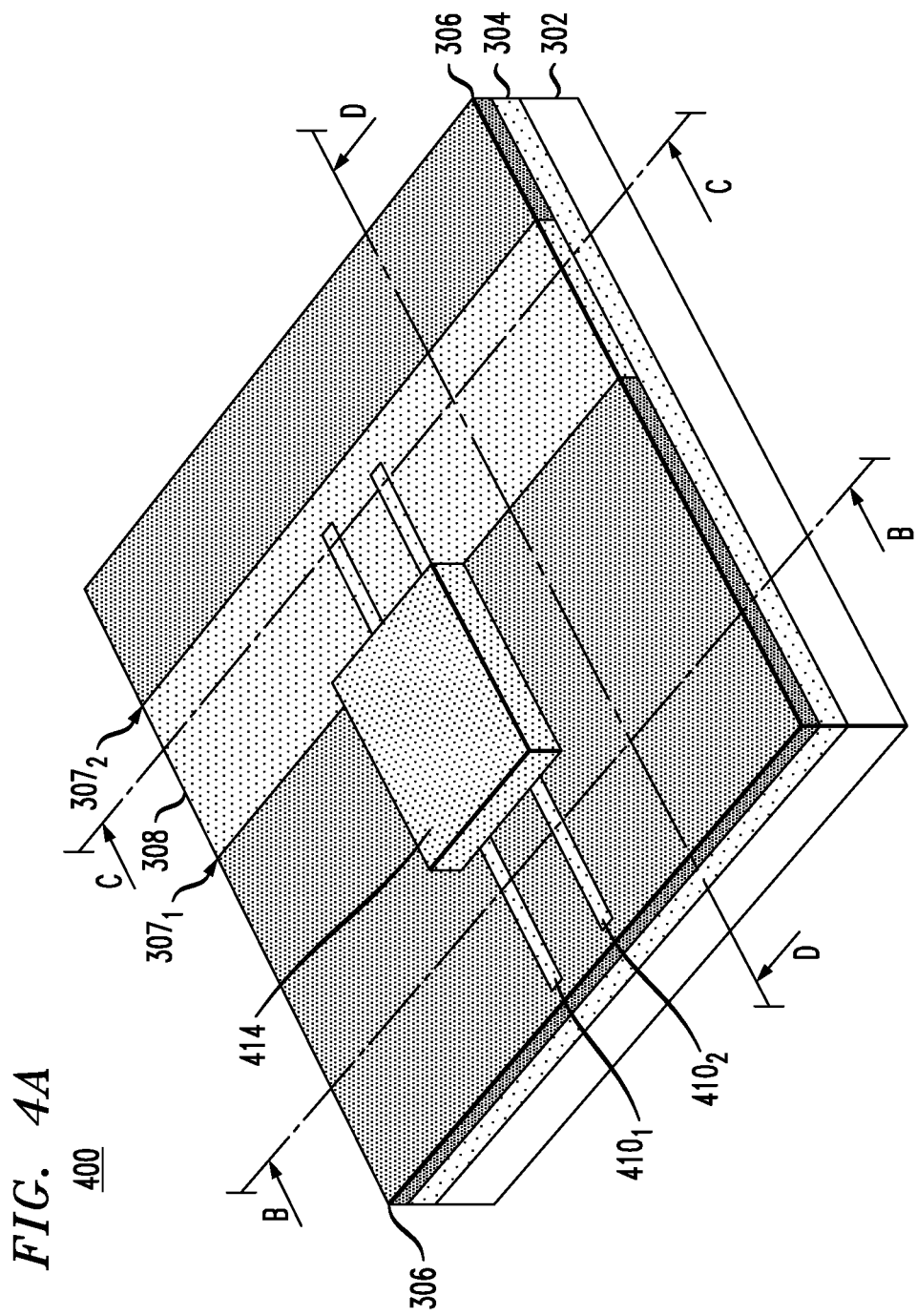
FIGS. 4A-4D show various schematic views of an RF-circuit element according to an alternative embodiment of the disclosure.
Figure 4B:
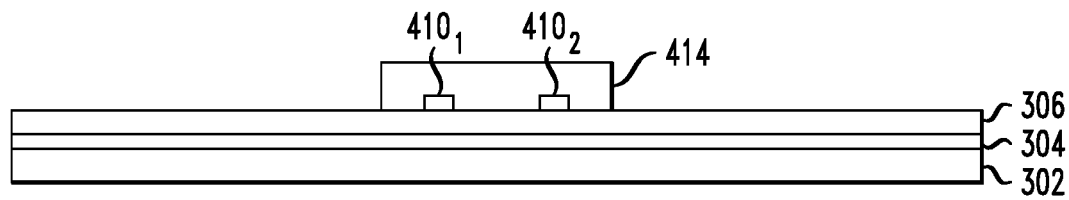
Figure 4C:
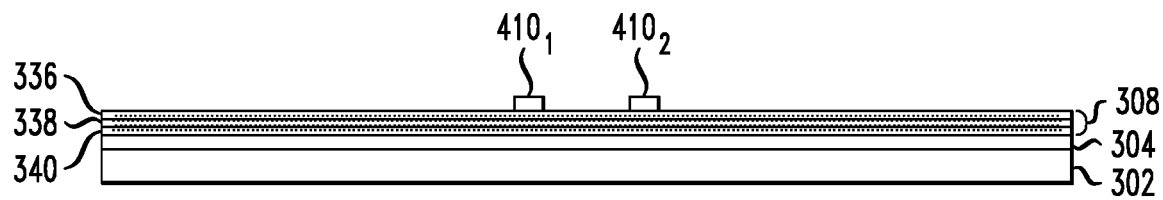
Figure 4D:
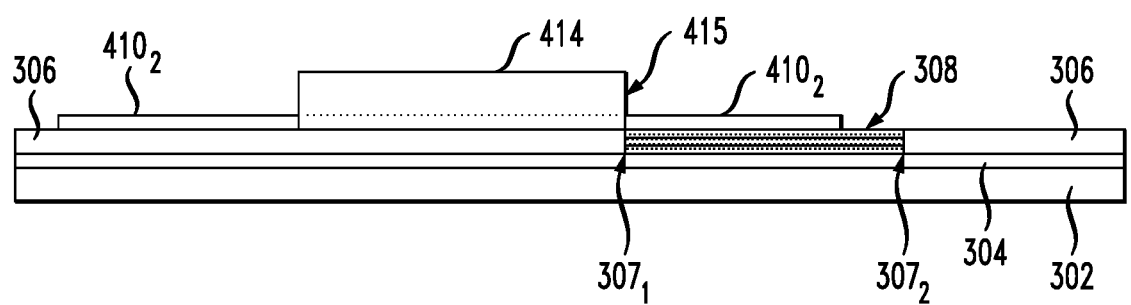

FIGS. 4A-4D show various schematic views of an RF-circuit element 400 according to an alternative embodiment of the disclosure. More specifically, FIG. 4A shows (not to scale) a three-dimensional view of element 400. FIGS. 4B-4D show (not to scale) cut-away side views of element 400 corresponding to cross-section planes BB, CC, and DD, respectively, shown in FIG. 4A.

RF-circuit element 400 includes some of the same structural components as RF-circuit element 300 (FIG. 3) and, as such, can be manufactured in a similar manner. For a description of these structural components, which are designated in FIG. 4 using the same reference labels as in FIG. 3, the reader is referred to the above-provided description of RF-circuit element 300. The description that follows primarily focuses on the structural and functional differences between RF-circuit elements 300 and 400.

One difference between RF-circuit elements 300 and 400 is that instead of a single microstrip line 310 in the former, the latter has two microstrip lines, labeled $410_1$ and $410_2$. As the labeling implies, microstrip lines $410_1$ and $410_2$ are nominally identical to one another. A slab 414 of a dielectric material formed over middle portions of microstrip lines $410_1$ and $410_2$ provides relatively efficient RF-signal coupling between these microstrip lines. In an example embodiment, the size and material of slab 414 are selected such that the portions of microstrip lines $410_1$ and $410_2$ covered by slab 414 operate as a 3-dB coupler for these microstrip lines. In one embodiment, an edge 415 of slab 414 is lined up with junction $307_1$, e.g., as indicated in FIG. 4D.

Each of microstrip lines $410_1$ and $410_2$ terminates over multilayered structure 308 as shown in FIGS. 4A and 4D, with both of the microstrip lines having the same length from junction $307_1$ to the line's end (terminus). Due to this configuration, the reflective loads of microstrip lines $410_1$ and $410_2$ are nominally identical, which results in the following S-factors for element 400:

$$S_{11}=0 \quad (4a)$$

$$S_{21}=-j\Gamma \quad (4b)$$

where $S_{11}$ is the reflection coefficient of element 400; $S_{21}$ is the transmission coefficient of element 400; and $\Gamma$ is the reflection coefficient corresponding to the reflective load formed by the portions of microstrip lines $410_1$ and $410_2$ located over multilayered structure 308 (see FIGS. 4A, 4C, and 4D). One of ordinary skill in the art will understand that reflection coefficient $\Gamma$ depends on the dielectric characteristics of multilayered structure 308 and, as such, is tunable by the application of a dc-bias voltage between base layer 304 and microstrip lines $410_1$ and $410_2$. In different possible configurations, the dc-bias voltage between base layer 304 and microstrip line $410_1$ may be the same as or different from the dc-bias voltage between base layer 304 and microstrip line $410_2$.

In one embodiment, RF-circuit element 400 may be configured to operate as a variable, electrically controllable phase shifter. In operation, the electrical RF signal that needs to be phase-shifted is applied to one of microstrip lines $410_1$ and $410_2$ at the line's end located over dielectric layer 306, and the corresponding phase-shifted electrical RF signal is collected from the other one of microstrip lines $410_1$ and $410_2$ at the line's end located over dielectric layer 306 (see, e.g., FIG. 4A). In the OFF state of the phase shifter, microstrip lines $410_1$ and $410_2$ are not dc-biased. In the ON state of the phase shifter, a dc-bias voltage of about 3V is applied to each of microstrip lines $410_1$ and $410_2$ in addition to the electrical RF signal. The total phase variance achieved in this manner in element 400 may be expressed in a manner similar to that of Eq. (3).

Figure 5:
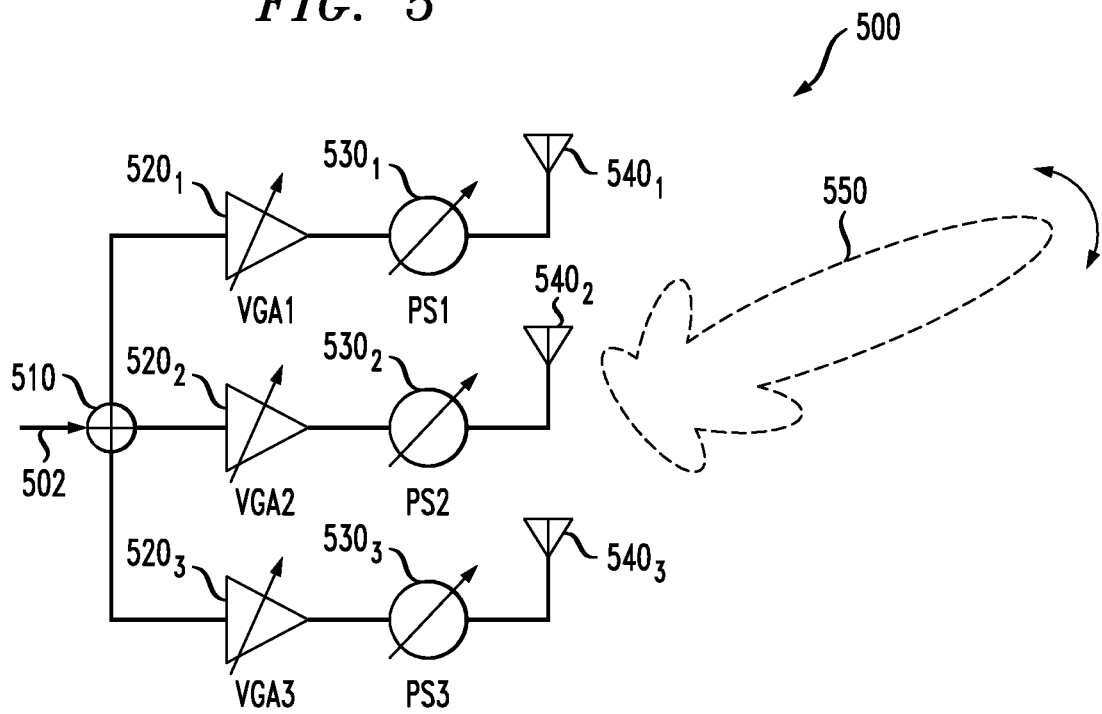
FIG. 5 shows a block diagram of an RF circuit according to an embodiment of the disclosure.

FIG. 5 shows a block diagram of an RF circuit 500 according to an embodiment of the disclosure. More specifically, RF circuit 500 is a beam-forming transmitter having a plurality of antennas $540_1$-$540_3$. An electrical input signal 502 is split into multiple (e.g., attenuated) copies in an RF-signal splitter 510. Each of signal copies is then amplified in a respective one of variable-gain amplifiers (VGAs) $520_1$-$520_3$ and then phase-shifted in a respective one of variable phase shifters (PSs) $530_1$-$530_3$. The amplitude adjustments and the phase shifts introduced by variable-gain amplifiers $520_1$-$520_3$ and variable phase shifters $530_1$-$530_3$, respectively, shape the overall radiation pattern produced by transmitter 500. For example, the dashed line labeled 550 in FIG. 5 shows an example of such a radiation pattern. The direction of the main lobe of radiation pattern 550 can be steered, e.g., as indicated in FIG. 5 by the double-headed arrow, by appropriately tuning variable phase shifters $530_1$-$530_3$. In an example embodiment, each or some of variable phase shifters $530_1$-$530_3$ may include one or more RF-circuit elements 300 and/or 400, with the tuning of the phase shifters being performed by appropriately changing the dc-bias voltage(s) applied to multilayered structure(s) 308 therein (see FIGS. 3-4).

Figure 6:
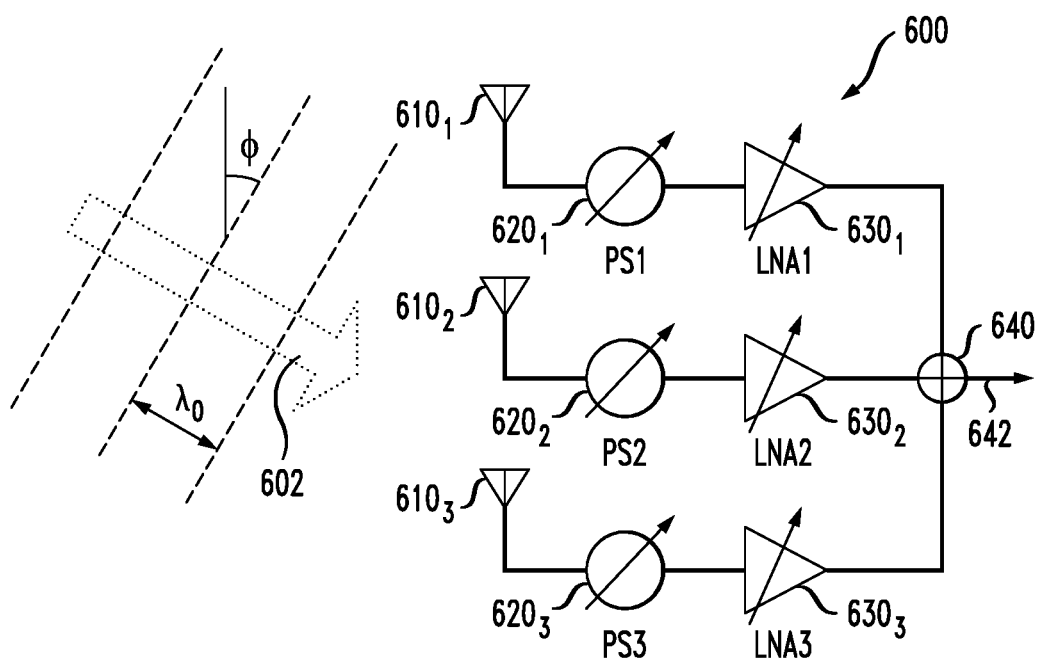
FIG. 6 shows a block diagram of an RF circuit according to an alternative embodiment of the disclosure.

FIG. 6 shows a block diagram of an RF circuit 600 according to an alternative embodiment of the disclosure. More specifically, RF circuit 600 is a beam-forming receiver having a plurality of antennas $610_1$-$610_3$. An incident electromagnetic wave 602 impinges on antennas $610_1$-$610_3$ at an incident angle $\phi$. If antennas $610_1$-$610_3$ are spaced at a sufficient distance from one another, then the radiation noise of different antennas is uncorrelated, and the receiver noise sources in each signal path having a respective one of variable phase shifters $620_1$-$620_3$ and a respective one of low-noise amplifiers (LNAs) $630_1$-$630_3$ are independent of one another. As a result, the phase shifts and the amplitude adjustments introduced by variable phase shifters $620_1$-$620_3$ and low-noise amplifiers $630_1$-$630_3$, respectively, can be used to take into account the incident angle $\phi$ and cause the RF signals generated by antennas $610_1$-$610_3$ to add coherently at an RF-signal combiner 640 while the noise adds incoherently thereat, thereby creating an improvement in the signal-to-noise ratio of an electrical output signal 642 generated by receiver 600. In an example embodiment, each or some of variable phase shifters $620_1$-$620_3$ may include one or more RF-circuit elements 300 and/or 400, with the tuning of the phase shifters being performed by appropriately changing the dc-bias voltage(s) applied to multilayered structure(s) 308 therein (see FIGS. 3-4).

According to an example embodiment disclosed above in reference to FIGS. 1-6, provided is an apparatus comprising an electrical circuit (e.g., 500, FIG. 5; 600, FIG. 6) configured to process an electrical radio-frequency (RF) signal, wherein the electrical circuit comprises a multilayered structure (e.g., 100, FIG. 1; 308, FIGS. 3 and 4) that includes a layer (e.g., 110, FIG. 1; 340, FIGS. 3C and 4C) of a first electrochromic material.

In some embodiments of the above apparatus, the multilayered structure is part of a circuit element (e.g., 300, FIG. 3; 400, FIG. 4; 530, FIG. 5; 620, FIG. 6) configured to operate on the electrical RF signal as a variable, electrically controllable phase shifter.

In some embodiments of any of the above apparatus, the multilayered structure comprises a base layer (e.g., 304, FIGS. 3 and 4) adjacent to the layer of the first electrochromic material; the circuit element comprises a microstrip line (e.g., 310, FIG. 3; 410, FIG. 4) adjacent to the multilayered structure and located at a first non-zero offset distance from the base layer and at a second non-zero offset distance from the layer of the first electrochromic material, the second non-zero offset distance being smaller than the first non-zero offset distance; the microstrip line is configured to carry the electrical RF signal; and a phase shift imparted on the electrical RF signal in the circuit element is controllable by a dc-bias voltage between the base layer and the microstrip line.

In some embodiments of any of the above apparatus, the apparatus is configured to change the dc-bias voltage.

In some embodiments of any of the above apparatus, the phase shifter is configured to be in an OFF state at a first value of the dc-bias voltage; the phase shifter is further configured to be in an ON state at a second value of the dc-bias voltage; and the first value and the second value differ by no more than about 3 V (e.g., differ by less than exactly 5 V).

In some embodiments of any of the above apparatus, the electrical circuit further comprises a first dielectric layer (e.g., $306_1$, FIG. 3A) adjacent to a base layer (e.g., 304, FIGS. 3 and 4), wherein: the multilayered structure is adjacent to the base layer; and an edge (e.g., $307_1$, FIGS. 3A and 4A) of the first dielectric layer is directly connected to a corresponding edge of the multilayered structure.

In some embodiments of any of the above apparatus, the electrical circuit further comprises a first microstrip line (e.g., 310, FIG. 3; $410_1$, FIG. 4) adjacent to the multilayered structure, wherein: a first portion of the first microstrip line is adjacent to a surface of the first dielectric layer and located at a first non-zero offset distance from the base layer; and a second portion of the first microstrip line is adjacent to a surface of the multilayered structure and located at the first non-zero offset distance from the base layer.

In some embodiments of any of the above apparatus, the electrical circuit further comprises a second dielectric layer (e.g., $306_2$, FIG. 3A) adjacent to the base layer and laterally separated from the first dielectric layer.

In some embodiments of any of the above apparatus, an edge (e.g., $307_2$, FIGS. 3A and 4A) of the second dielectric layer is directly connected to a corresponding edge of the multilayered structure.

In some embodiments of any of the above apparatus, a third portion of the first microstrip line is adjacent to a surface of the second dielectric layer and located at the first non-zero offset distance from the base layer (e.g., as shown in FIG. 3D).

In some embodiments of any of the above apparatus, the first microstrip line has an end on the surface of the multilayered structure (e.g., as shown in FIG. 4D).

In some embodiments of any of the above apparatus, the electrical circuit further comprises a second microstrip line (e.g., $410_2$, FIG. 4) adjacent to the multilayered structure, wherein: a first portion of the second microstrip line is adjacent to the surface of the first dielectric layer and located at the first non-zero offset distance from the base layer; and a second portion of the second microstrip line is adjacent to the surface of the multilayered structure and located at the first non-zero offset distance from the base layer.

In some embodiments of any of the above apparatus, the first microstrip line has an end on the surface of the multilayered structure (e.g., as shown in FIG. 4D); and the second microstrip line has an end on the surface of the multilayered structure (e.g., as shown in FIG. 4A).

In some embodiments of any of the above apparatus, the first microstrip line is electrically insulated from the second microstrip line (e.g., as shown in FIG. 4A).

In some embodiments of any of the above apparatus, the electrical circuit further comprises a dielectric slab (e.g., 414, FIGS. 4A and 4D) formed on the surface of the first dielectric layer over a portion of the first microstrip line and a portion of the second microstrip line to provide ac coupling between the first and second microstrip lines in the amount of about (e.g., within +/−10% of) 3 dB.

In some embodiments of any of the above apparatus, an edge (e.g., 415, FIG. 4D) of the dielectric slab is aligned with the edge (e.g., $307_1$, FIG. 4D) of the first dielectric layer that is directly connected to the corresponding edge of the multilayered structure.

In some embodiments of any of the above apparatus, the multilayered structure further comprises a layer (e.g., 108, FIG. 1; 338, FIGS. 3 and 4) of a solid-electrolyte material, wherein the layer of the first electrochromic material is sandwiched between the base layer and the layer of the solid-electrolyte material.

In some embodiments of any of the above apparatus, the multilayered structure further comprises an ion-storage layer (e.g., 106, FIG. 1; 336, FIGS. 3 and 4) configured to exchange ions with the layer of the solid-electrolyte material.

In some embodiments of any of the above apparatus, the ion-storage layer comprises a second electrochromic material different from the first electrochromic material.

In some embodiments of any of the above apparatus, the ion-storage layer comprises a polymer.

In some embodiments of any of the above apparatus, the first electrochromic material comprises an inorganic oxide.

In some embodiments of any of the above apparatus, the first electrochromic material comprises a polymer.

Although some embodiments have been described in reference to microstrip lines, e.g., 310 (FIG. 3) and 410 (FIG. 4), the term "microstrip line" is a term of art that should be construed as not necessarily implying a μm-size scale. Some embodiments can be implemented at any scale, including scales larger and smaller than the μm-size scale.

While this disclosure includes references to illustrative embodiments, this specification is not intended to be construed in a limiting sense. Various modifications of the described embodiments, as well as other embodiments within the scope of the disclosure, which are apparent to persons skilled in the art to which the disclosure pertains are deemed to lie within the principle and scope of the disclosure, e.g., as expressed in the following claims.

Unless explicitly stated otherwise, each numerical value and range should be interpreted as being approximate as if the word "about" or "approximately" preceded the value of the value or range.

It will be further understood that various changes in the details, materials, and arrangements of the parts which have been described and illustrated in order to explain the nature of this disclosure may be made by those skilled in the art without departing from the scope of the disclosure, e.g., as expressed in the following claims.

Although the elements in the following method claims, if any, are recited in a particular sequence with corresponding labeling, unless the claim recitations otherwise imply a particular sequence for implementing some or all of those elements, those elements are not necessarily intended to be limited to being implemented in that particular sequence.

Reference herein to "one embodiment" or "an embodiment" means that a particular feature, structure, or characteristic described in connection with the embodiment can be included in at least one embodiment of the disclosure. The appearances of the phrase "in one embodiment" in various places in the specification are not necessarily all referring to the same embodiment, nor are separate or alternative embodiments necessarily mutually exclusive of other embodiments. The same applies to the term "implementation."

Throughout the detailed description, the drawings, which are not to scale, are illustrative only and are used in order to explain, rather than limit the disclosure. The use of terms such as height, length, width, top, bottom, is strictly to facilitate the description of the embodiments and is not intended to limit the embodiments to a specific orientation. For example, height does not imply only a vertical rise limitation, but is used to identify one of the three dimensions of a three-dimensional structure as shown in the figures. Such "height" would be vertical where the layers are horizontal but would be horizontal where the layers are vertical, and so on. Similarly, while all figures show the different layers as horizontal layers such orientation is for descriptive purpose only and not to be construed as a limitation.

Also for purposes of this description, the terms "couple," "coupling," "coupled," "connect," "connecting," or "connected" refer to any manner known in the art or later developed in which energy is allowed to be transferred between two or more elements, and the interposition of one or more additional elements is contemplated, although not required. Conversely, the terms "directly coupled," "directly connected," etc., imply the absence of such additional elements.

The described embodiments are to be considered in all respects as only illustrative and not restrictive. In particular, the scope of the disclosure is indicated by the appended claims rather than by the description and figures herein. All changes that come within the meaning and range of equivalency of the claims are to be embraced within their scope.

The description and drawings merely illustrate the principles of the disclosure. It will thus be appreciated that those of ordinary skill in the art will be able to devise various arrangements that, although not explicitly described or shown herein, embody the principles of the disclosure and are included within its spirit and scope. Furthermore, all examples recited herein are principally intended expressly to be only for pedagogical purposes to aid the reader in understanding the principles of the disclosure and the concepts contributed by the inventor(s) to furthering the art, and are to be construed as being without limitation to such specifically recited examples and conditions. Moreover, all statements herein reciting principles, aspects, and embodiments of the disclosure, as well as specific examples thereof, are intended to encompass equivalents thereof.

What is claimed is:

1. An apparatus comprising an electrical circuit configured to process an electrical radio-frequency (RF) signal,
   wherein the electrical circuit comprises a multilayered structure that includes a layer of a first electrochromic material, the multilayered structure being adjacent to a base layer;
   wherein the electrical circuit further comprises a first microstrip line adjacent to the multilayered structure and a first dielectric layer adjacent to the base layer, the first microstrip line being configured to carry the electrical RF signal; and
   wherein an edge of the first dielectric layer is directly connected to a corresponding edge of the multilayered structure.

2. The apparatus of claim 1, wherein the multilayered structure is part of a circuit element configured to operate on the electrical RF signal as a variable electrically controllable phase shifter.

3. The apparatus of claim 2, wherein:
   the first microstrip line is located at a first non-zero offset distance from the base layer and at a second non-zero offset distance from the layer of the first electrochromic material, the second non-zero offset distance being smaller than the first non-zero offset distance; and
   a phase shift imparted on the electrical RF signal in the circuit element is controllable by a dc-bias voltage between the base layer and the first microstrip line.

4. The apparatus of claim 3, wherein the apparatus is configured to change the dc-bias voltage.

5. The apparatus of claim 3, wherein:
   the phase shifter is configured to be in an OFF state at a first value of the dc-bias voltage;
   the phase shifter is configured to be in an ON state at a second value of the dc-bias voltage; and
   the first value and the second value differ by no more than 5 V.

6. The apparatus of claim 1, wherein the first electrochromic material comprises a polymer.

7. The apparatus of claim 1, wherein:
   a first portion of the first microstrip line is adjacent to a surface of the first dielectric layer and located at a first non-zero offset distance from the base layer; and
   a second portion of the first microstrip line is adjacent to a surface of the multilayered structure and located at the first non-zero offset distance from the base layer.

8. The apparatus of claim 7,
   wherein the electrical circuit further comprises a second dielectric layer adjacent to the base layer and laterally separated from the first dielectric layer; and
   wherein an edge of the second dielectric layer is directly connected to a corresponding edge of the multilayered structure.

9. The apparatus of claim 8, wherein a third portion of the first microstrip line is adjacent to a surface of the second dielectric layer and located at the first non-zero offset distance from the base layer.

10. The apparatus of claim 8, wherein the first microstrip line has an end on the surface of the multilayered structure.

11. The apparatus of claim 7, wherein the electrical circuit further comprises a second microstrip line adjacent to the multilayered structure, wherein:
    a first portion of the second microstrip line is adjacent to the surface of the first dielectric layer and located at the first non-zero offset distance from the base layer; and
    a second portion of the second microstrip line is adjacent to the surface of the multilayered structure and located at the first non-zero offset distance from the base layer.

12. The apparatus of claim 11, wherein:
    the first microstrip line has an end on the surface of the multilayered structure; and
    the second microstrip line has an end on the surface of the multilayered structure.

13. The apparatus of claim 11, wherein the first microstrip line is electrically insulated from the second microstrip line.

14. The apparatus of claim 11, wherein the electrical circuit further comprises a dielectric slab formed on the surface of the first dielectric layer over a portion of the first microstrip line and a portion of the second microstrip line to provide ac coupling between the first and second microstrip lines in the amount of about 3 dB.

15. The apparatus of claim 14, wherein an edge of the dielectric slab is aligned with the edge of the first dielectric layer that is directly connected to the corresponding edge of the multilayered structure.

16. The apparatus of claim 1, wherein the multilayered structure further comprises a layer of a solid-electrolyte material, wherein the layer of the first electrochromic material is sandwiched between the base layer and the layer of the solid-electrolyte material.

17. The apparatus of claim 16, wherein the multilayered structure further comprises an ion-storage layer configured to exchange ions with the layer of the solid-electrolyte material.

18. The apparatus of claim 17, wherein the ion-storage layer comprises a second electrochromic material different from the first electrochromic material.

19. The apparatus of claim 17,
    wherein the ion-storage layer comprises a polymer; and
    wherein the first electrochromic material comprises an inorganic oxide.

20. An apparatus comprising an electrical circuit configured to process an electrical radio-frequency (RF) signal, wherein:
    the electrical circuit comprises a multilayered structure that includes a layer of a first electrochromic material;
    the multilayered structure comprises a base layer adjacent to the layer of the first electrochromic material; and
    the electrical circuit comprises a microstrip line adjacent to the multilayered structure and located at a first non-zero offset distance from the base layer and at a second non-zero offset distance from the layer of the first electrochromic material, the second non-zero offset distance being smaller than the first non-zero offset distance, the microstrip line being configured to carry the electrical RF signal.

21. The apparatus of claim 20, wherein
    a phase shift imparted on the electrical RF signal in the electrical circuit is controllable by a dc-bias voltage between the base layer and the microstrip line.

22. The apparatus of claim 21, wherein the apparatus is configured to change the dc-bias voltage.

23. The apparatus of claim 21, wherein:
the multilayered structure is part of a circuit element configured to operate on the electrical RF signal as a variable electrically controllable phase shifter;
the phase shifter is configured to be in an OFF state at a first value of the dc-bias voltage;
the phase shifter is configured to be in an ON state at a second value of the dc-bias voltage; and
the first value and the second value differ by no more than 5 V.

* * * * *